(12) United States Patent
Daudin et al.

(10) Patent No.: US 12,720,917 B2
(45) Date of Patent: Aug. 25, 2026

(54) LIGHT-EMITTING DIODE WITH EMISSIVE REGIONS INCLUDING RARE EARTH IONS

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris Cedex (FR)

(72) Inventors: Bruno Daudin, Grenoble Cedex (FR); Gwenole Jacopin, Grenoble Cedex (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris Cedex (FR)

( * ) Notice: Subject to any disclaimer, the term of this patent is extended or adjusted under 35 U.S.C. 154(b) by 375 days.

(21) Appl. No.: 18/264,606

(22) PCT Filed: Feb. 2, 2022

(86) PCT No.: PCT/FR2022/050200
§ 371 (c)(1),
(2) Date: Aug. 8, 2023

(87) PCT Pub. No.: WO2022/171948
PCT Pub. Date: Aug. 18, 2022

(65) Prior Publication Data

US 2024/0304758 A1 Sep. 12, 2024

(30) Foreign Application Priority Data

Feb. 9, 2021 (FR) ...................................... 2101228

(51) Int. Cl.
*H10H 20/825* (2025.01)
*H10H 20/01* (2025.01)
(Continued)

(52) U.S. Cl.
CPC .... *H10H 20/8252* (2025.01); *H10H 20/0137* (2025.01); *H10H 20/81* (2025.01); *H10H 20/8215* (2025.01); *H10H 29/142* (2025.01)

(58) Field of Classification Search
None
See application file for complete search history.

(56) References Cited

U.S. PATENT DOCUMENTS 7,709,826 B2 * 5/2010 Atanackovic ..... H10P 14/69396 257/17
8,071,872 B2 * 12/2011 Atanackovic ....... H10F 30/2235 136/255
(Continued)

FOREIGN PATENT DOCUMENTS

FR 2904730 * 10/2006 ............. H01L 33/00
FR 2 904 730 A1 2/2008
(Continued)

OTHER PUBLICATIONS

Machine translation of FR2904730 is attached (Year: 2006).*
(Continued)

*Primary Examiner* — Bilkis Jahan
(74) *Attorney, Agent, or Firm* — Oblon, McClelland, Maier & Neustadt, L.L.P.

(57) ABSTRACT

A method for producing a display device comprising several pixels. The production of each pixel includes producing a stack forming p-i-n junctions of semiconductors corresponding to compounds comprising nitrogen and aluminium and/or gallium and/or indium atoms; implanting first, second and third rare earth ions respectively in first, second and third
(Continued)

parts of a nest portion, through masks comprising first, second and third openings disposed respectively facing first, second and third regions of the stack respectively forming first, second and third light emission regions.

14 Claims, 5 Drawing Sheets

(51) Int. Cl.
*H10H 20/81* (2025.01)
*H10H 29/14* (2025.01)

(56) References Cited

U.S. PATENT DOCUMENTS

2004/0206979 A1* 10/2004 Braddock ............ H10D 30/801 257/E29.252
2017/0207249 A1* 7/2017 Rhee .................... H10D 86/451
2017/0279066 A1* 9/2017 Niu ........................ H10K 59/38
2019/0252184 A1* 8/2019 Chen ................. H10P 14/69396
2019/0333964 A1 10/2019 Lee et al.

FOREIGN PATENT DOCUMENTS

JP 2009-212308 A 9/2009
WO WO 2008/144337 A1 11/2008

OTHER PUBLICATIONS

International Search Report issued May 27, 2022 in PCT/FR2022/050200 filed on Feb. 2, 2022 citing documents 1-2 & 15-17 & 24 therein 3 pages.

Cardoso, J. et al., "Europium-Implanted AlN Nanowires for Red Light-Emitting Diodes", ACS Applied Nano Materials, vol. 5, No. 1, Jan. 28, 2022 (13 pages).

* cited by examiner

LIGHT-EMITTING DIODE WITH EMISSIVE REGIONS INCLUDING RARE EARTH IONS

CROSS-REFERENCE TO RELATED APPLICATIONS

The present application is a 35 U.S.C. § 371 national stage patent application of International patent application PCT/FR2022/050200, filed on Feb. 2 2022, which is based on and claims the benefits of priority to French Application No. 2101228, filed on Feb. 9, 2021. The entire contents of all of the above applications are incorporated herein by reference.

TECHNICAL FIELD

The invention relates to the field of display devices using light-emitting diodes, or LEDs, and more particularly that of micro-display devices using LEDs.

PRIOR ART

The display devices, in particular the micro-display devices used for example for smartphone screens, include a set of pixels. Each pixel includes at least three LEDs or micro-LEDs, each forming a sub-pixel, each locally producing one of the following three elementary or primary colours: red, green and blue. In this case, RBG pixels are considered.

Such a display device is generally produced by assembling the various LEDs on a support, for a large number of pixels. This assembly step is delicate to be carried out without defects. However, a single one of these defects produces a pixel called "black" pixel that does not emit the desired colour, which is unacceptable for a display device intended for sale.

Currently, the LEDs used for producing such a display device generally include organic materials and are called OLEDs ("Organic Light-emitting Diodes"). The three colours red, green and blue are obtained from different organic materials. For each colour, structures with large surfaces are manufactured then cut into small elements, each corresponding to a LED, prior to the final assembly. This solution is expensive and has limited reliability.

Furthermore, the luminance of OLED-based display devices remains limited. This luminance can be improved by using LEDs made from semiconductors. Indeed, nitride-based semiconductor materials allow to manufacture LEDs that are very efficient in the blue and, to a lesser extent, in the green. In particular, GaN/InGaN heterostructures are used wherein the amount of indium incorporated is adjusted in order to modify the emission wavelength of the LEDs. However, these nitride-based semiconductor materials do not allow to obtain, with this same technology, red LEDs as efficient as blue or green LEDs. It is therefore necessary, to form the red sub-pixels, to use another family of materials, namely that of the phosphides (GaP/GaInP). This technical complication as well as the difficulties related to the faultless assembly of a large number of LEDs currently limit the performance and the size of the display devices that can be produced.

It is also known to produce monochromatic LEDs by implanting rare earth ions in GaN or AlN nanowires. However, this solution is also confronted with the problems associated with the assembly of the sub-pixels thus produced and with the defects which result therefrom.

DESCRIPTION OF THE INVENTION

An object of the present invention is to propose a solution allowing the production of a display device comprising pixels formed of several monochromatic sub-pixels of the LED type and not having the disadvantages related to the assembly of several sub-pixels made separately to form each of the pixels.

For this purpose, a method for producing a display device comprising several pixels is described, the production of each pixel including at least:

producing a stack comprising at least a first portion of n-doped semiconductor, a second portion of p-doped semiconductor and a third portion of unintentionally doped semiconductor and disposed between the first and second portions, the semiconductors of the first, second and third portions corresponding to compounds comprising nitrogen atoms as well as aluminium and/or gallium and/or indium atoms;

implanting first rare earth ions in at least one first part of the third portion, through a first mask comprising at least one first opening disposed facing at least one first region of the stack intended to form at least one first light emission region, or at least one first sub-pixel;

implanting second rare earth ions, of a nature different from that of the first rare earth ions, in at least one second part of the third portion distinct from the first part of the third portion, through a second mask comprising at least one second opening disposed facing at least one second region of the stack distinct from the first region and intended to form at least one second light emission region, or at least one second sub-pixel;

implanting third rare earth ions, of a nature different from those of the first and second rare earth ions, in at least one third part of the third portion distinct from the first and second parts of the third portion, through a third mask comprising at least one third opening disposed facing at least one third region of the stack distinct from the first and second regions and intended to form at least one third light emission region.

A method for producing a display device comprising several pixels is also proposed, the production of each pixel including at least:

producing a stack comprising at least one first portion of n-doped semiconductor and another portion, called third portion of unintentionally doped semiconductor disposed on the first portion, the semiconductors of the first and third portions corresponding to compounds comprising nitrogen atoms as well as aluminium and/or gallium and/or indium atoms, then implanting first rare earth ions in at least one first part of the third portion, through a first mask comprising at least one first opening disposed facing at least one first region of the stack intended to form at least one first light emission region;

implanting second rare earth ions, of a nature different from that of the first rare earth ions, in at least one second part of the third portion distinct from the first part of the third portion, through a second mask comprising at least one second opening disposed facing at least one second region of the stack distinct from the first region and intended to form at least one second light emission region, implanting third rare earth ions, of a nature different from those of the first and second rare earth ions, in at least one third part of the third portion distinct from the first and second parts of the third portion, through a third mask comprising at least one third opening disposed facing at least one third region of the stack distinct from the first and second regions and intended to form at least one third light emission region;

wherein the stack further includes a second portion of p-doped semiconductor such that the third portion is disposed between the first and second portions, the semiconductor of the second portion corresponding to a compound comprising nitrogen atoms as well as aluminium and/or gallium and/or indium atoms, the second portion being produced before or after the implementation of the steps of implanting the first, second and third rare earth ions;

and wherein the first, second and third regions of the stack are distinct from each other in a plane parallel to an upper face of the stack.

Said at least one first region of the stack includes said at least one first part of the third portion of unintentionally doped semiconductor. Said at least one first region of the stack and said at least one first part of the third portion of unintentionally doped semiconductor are defined geometrically (shape and dimensions), in a plane parallel to the face of the stack on which is disposed the first mask, by the shape and dimensions of said at least one first opening of the first mask.

Said at least one second region of the stack includes said at least one second part of the third portion of unintentionally doped semiconductor. Said at least one second region of the stack and said at least one second part of the third portion of unintentionally doped semiconductor are defined geometrically (shape and dimensions), in a plane parallel to the face of the stack on which is disposed the second mask, by the shape and dimensions of said at least one second opening of the second mask.

Said at least one third region of the stack includes said at least one third part of the third portion of unintentionally doped semiconductor. Said at least one third region of the stack and said at least one third part of the third portion of unintentionally doped semiconductor are defined geometrically (shape and dimensions), in a plane parallel to the face of the stack on which is disposed the third mask, by the shape and dimensions of said at least one third opening of the third mask.

This method proposes successively performing implantations of rare earth ions in a localised manner in different regions of the stack forming, or intended to form, p-n junctions of the pixels of the display device, to obtain several regions of light emission, or sub-pixels, forming LEDs capable of emitting light of different wavelengths from the visible range which depend on the nature of the rare earth ions implanted. The sub-pixels of the display device are therefore made successively in-situ in the same semiconductor stack, thus avoiding the implementation of an assembly of LEDs made separately to form the pixels of the display device.

In a first configuration, the second portion can be produced before the implementation of the rare earth ion implantation steps. In this case, the first, second and third portions of the stack can be made by uninterrupted growth until the completion of the second portion. The rare earth ions are then implanted through the second portion until they reach the different parts of the third portion of semiconductor.

In a second configuration, the second portion can be produced after the implementation of the rare earth ion implantation steps. In this case, the first and third portions of semiconductor can be made by growth. Growth can then be interrupted, then the implantations can be implemented. In this second configuration, the implanted rare earth ions do not have to cross the second portion of semiconductor, which allows to implement the ion implantation steps with less energy and to reduce the variations on the implantation profile obtained. After the implementation of the implantations, the growth can be restarted to produce the second portion of semiconductor and thus complete the production of the p-n junctions forming the pixels of the display device.

Furthermore, this method does not use organic materials and potentially allows to obtain better luminance than that obtained for OLED-based display devices.

In addition, thanks to the low spectral width obtained, characteristic of the emission of rare earth ions, it is potentially possible to obtain a wider colour range compared to OLED-based display devices.

This method is advantageously implemented to produce an RGB pixel display device, that is to say each including at least three sub-pixels emitting wavelengths corresponding to the colours red, green and blue. But in general, this method can be implemented to produce display devices equipped with pixels each including at least three sub-pixels emitting different wavelengths and which do not necessarily correspond to RGB pixels.

This method can be implemented to produce a large-area display device, that is to say the dimensions of which are, for example, $5\times7$ cm$^2$. The subsequent assembly of several of these devices can allow to increase by an arbitrarily large factor the size of the final device to reach that of a computer or television screen or for wall display.

Throughout the document, the term "LED" is used to designate a LED or a micro-LED, without distinction of its dimensions.

In this method, the rare earth ion implantation steps are implemented after the production of at least part of the stack, that is to say comprising at least the first and third portions, and possibly the second portions in the case of the first configuration.

The semiconductors of the first, second and third portions may correspond to GaN, or AlN, or AlGaN, or InGaN, or AlGaInN.

An unintentionally doped semiconductor, or nest, corresponds to a semiconductor that has not undergone a doping step during which doping atoms are introduced into the semiconductor.

A method for producing a display device comprising several pixels is also proposed, said method including at least:

producing a stack comprising at least one first portion of n-doped semiconductor, one second portion of p-doped semiconductor and one third portion of unintentionally doped semiconductor and disposed between the first and second portions, the semiconductors of the first, second and third portions corresponding to compounds comprising nitrogen atoms as well as aluminium and/or gallium and/or indium atoms;

implanting first rare earth ions in first parts of the third portion, through a first mask comprising first openings disposed facing first regions of the stack including the first parts of the third portion and intended to form, for each pixel, at least one first light emission region, or at least one first sub-pixel;

implanting second rare earth ions, of a nature different from that of the first rare earth ions, in second parts of the third portion distinct from the first parts of the third portion, through a second mask comprising second openings disposed facing second regions of the stack including the second parts of the third portion, distinct from the first regions and intended to form, for each pixel, at least one second light emission region, or at least one second sub-pixel.

A method for producing a display device comprising several pixels is also proposed, said method including at least:

producing a stack comprising at least one first portion of n-doped semiconductor and another portion, called third portion of unintentionally doped semiconductor disposed on the first portion, the semiconductors of the first and third portions corresponding to compounds comprising nitrogen atoms as well as aluminium and/or gallium and/or indium atoms;

implanting first rare earth ions in first parts of the third portion, through a first mask comprising first openings disposed facing first regions of the stack including the first parts of the third portion and intended to form, for each pixel, at least one first light emission region, or at least one first sub-pixel;

implanting second rare earth ions, of a nature different from that of the first rare earth ions, in second parts of the third portion distinct from the first parts of the third portion, through a second mask comprising second openings disposed facing second regions of the stack including the second parts of the third portion, distinct from the first regions and intended to form, for each pixel, at least one second light emission region, or at least one second sub-pixel.

wherein the stack further includes a second portion of p-doped semiconductor such that the third portion is disposed between the first and second portions, the semiconductor of the second portion corresponding to a compound comprising nitrogen atoms as well as aluminium and/or gallium and/or indium atoms, the second portion being produced before or after the implementation of the steps of implanting the first, second and third rare earth ions;

and wherein the first, second and third regions of the stack are distinct from each other in a plane parallel to an upper face of the stack.

This method may also include an implantation of third rare earth ions, of a nature different from those of the first and second rare earth ions, in third parts of the third portion distinct from the first and second parts of the third portion, through a third mask comprising third openings disposed facing third regions of the stack including the third parts of the third portion, distinct from the first and second regions, and intended to form, for each pixel, at least one third light emission region, or at least one third sub-pixel.

Each of the rare earth ion implantation steps implemented in this method corresponds to an implantation of at least one type of rare earth ions. In other words, each of the implantation steps can correspond to an implantation of rare earth ions of one or more different types, and optionally of atoms not corresponding to rare earth ions. For example, to optimise the chemical process of light emission of rare earth ions for a given colour, it is possible to implant in the same emission region two different types of rare earth ions, possibly accompanied by atoms not corresponding to rare earth ions.

Furthermore, each of the rare earth ion implantation steps implemented can form, in each pixel, one or more sub-pixels, depending on the number of mask openings present at each pixel, and therefore depending on the number of parts of the third portion wherein the ions are implanted for each pixel at each of the implantation steps.

According to a particular embodiment, the semiconductor of the second portion can be doped with magnesium and/or indium atoms, and/or the semiconductor of the first portion can be doped with silicon and/or germanium atoms.

The electronic transitions involved in light emission from a semiconductor wherein rare earth ions have been implanted correspond to those occurring for deep electrons belonging to the 4f electron shell of rare earth ions. The screening of this shell by the electrons of the outer shells makes the emission very stable and independent of the nature of the surrounding material which can be crystalline or amorphous, semiconductor or insulator. When these rare earth ions are introduced into a semiconductor, the electronic transitions occurring in the 4f electron shell can be excited by the passage of a current, the return to the ground state then being accompanied by a light emission. The efficiency of the excitation and of the coupling, on the one hand, and the lifetime of the excited luminescence, on the other hand, are sensitive to the value of the gap of the semiconductor wherein the rare earth ions are implanted. The higher this gap, the more the total efficiency increases. In the method described here, the doping with magnesium and indium atoms of the p-doped semiconductor of the second portion allows to use wide-gap semiconductors such as AlN, for example, which allows to obtain light emission regions having a very good light efficiency.

The presence of indium in the semiconductor of the second portion allows to incorporate, compared to this same semiconductor not including any indium, a greater number of doping magnesium atoms because the atomic concentration of magnesium obtained is proportional to the amount of indium present in the semiconductor. Thus, the level of p-type doping that can be obtained in the semiconductor of the second portion is in this case greater and allows to obtain a greater current injection and a better distribution of the current lines. For example, the presence of indium in AlN or AlGaN allows to increase the limiting solubility of magnesium in these materials by a factor equal to about 10, and therefore increases the level of doping obtainable in this semiconductor.

The possibility of incorporating a greater number of magnesium atoms when the semiconductor includes indium is unexpected because these two types of atoms induce, when they are introduced separately into AlN, a compressive stress. There is therefore no a priori reason for their simultaneous introduction to be favourable in terms of accumulated elastic energy because the addition of indium does not contribute to the relaxation of the elastic stress induced by the addition of magnesium.

The atomic concentration of magnesium in the semiconductor of the second portion may be comprised between $10^{20}$ at/cm$^3$ and $10^{21}$ at/cm$^3$, or greater than $10^{20}$ at/cm$^3$, and/or the atomic concentration of silicon and/or germanium in the semiconductor of the first portion may be comprised between $10^{19}$ at/cm$^3$ and $10^{20}$ at/cm$^3$. Such an atomic concentration of magnesium is for example obtained when the ratio between the atomic concentration of magnesium and the atomic concentration of indium is comprised between 1 and 20, or between 1 and 50, or even between 1 and 100, and preferably of the order of 10. This configuration allows to obtain a good level of p-type doping of the semiconductor of the second portion thanks, for example, to the significant lowering of the effective ionisation energy of magnesium at such doping levels, and therefore a good injection of current into the LED thanks to the electrical conduction of the second portion which is close to or similar to that of a metal electrode.

The first, second and third earth ions can advantageously be selected such that the first, second and third light emission regions are capable of emitting wavelengths respectively of red, green and blue colour. The pixels thus produced correspond to RGB pixels.

The method may further include, for the production of each pixel, an implantation of fourth rare earth ions, advantageously of a nature similar to that of the first or of the second or of the third rare earth ions, implemented after the implantation of the third rare earth ions, in at least one fourth part of the third portion distinct from the first, second and third parts of the third portion, through a fourth mask comprising at least one fourth opening disposed facing at least one fourth region of the stack distinct from the first, second and third regions and intended to form at least one fourth light emission region, or at least one fourth sub-pixel.

Said at least one fourth region of the stack includes said at least one fourth part of the third portion of unintentionally doped semiconductor. Said at least one fourth region of the stack and said at least one fourth part of the third portion of unintentionally doped semiconductor are defined geometrically (shape and dimensions), in a plane parallel to the face of the stack on which is disposed the fourth mask, by the section of said at least one fourth opening of the fourth mask.

In this case, the implantations of the first, second, third and fourth rare earth ions can advantageously be implemented such that the first, second, third and fourth light emission regions are arranged, in each pixel, in the form of a 2×2 matrix, that is to say an arrangement forming two rows and two columns.

Each light emission region defines a sub-pixel which can be produced from a stack of planar layers, or from a stack of material in the form of nanowires, each pixel including at least three distinct light emission regions.

The first, second and third rare earth ions can be selected from europium ions (allowing the emission of red light), terbium and/or erbium (allowing the emission of green light), and thulium (allowing the emission of blue light). It is also possible to use praseodymium ions (allowing the emission of red light) and/or holmium (allowing the emission of green light) and/or cerium (allowing the emission of blue light).

The stack can be made on a substrate, and the stack can further include at least one n-doped GaN portion disposed between the substrate and the first portion. Such an n-doped GaN portion allows in this case to initiate growth of the first portion of n-doped semiconductor on any type of substrate, for example semiconductor, amorphous or metallic substrate.

The stack can be carried out by implementing:

steps of growing nanowires, or steps of depositing planar layers, or steps of depositing planar layers, then of etching the deposited layers forming nanowires.

In this case, the method may further include, when the stack is produced by implementing nanowire growth steps, a step of depositing an electrically insulating material between the nanowires, implemented after carrying out the stack and before implanting the first rare earth ions.

More generally, the device may include a stack of layers forming the different portions of the stack, or several nanowires disposed next to each other and together forming the different portions of the stack.

The semiconductors of the first, second and third portions can include AlN.

In a first embodiment, the method can be such that:

the first, second and third masks correspond to the same hard mask whose positions relative to the stack during the implantations of the first, second and third rare earth ions are different from each other, and when the method includes the implantation of the fourth rare earth ions, the fourth mask corresponds to the same hard mask as that forming the first, second and third masks and whose position relative to the stack during the implantation of the fourth rare earth ions is different from those during the implantations of the first, second and third rare earth ions.

In a second embodiment, the method can be such that:

the first mask is based on photosensitive resin and is removed before the implantation of the second rare earth ions, and the second mask is based on photosensitive resin and is removed after the implantation of the second rare earth ions, and the third mask is based on photosensitive resin and is removed after the implantation of the third rare earth ions, and when the method includes the implantation of the fourth rare earth ions, the fourth mask is based on photosensitive resin and is removed after the implantation of the fourth rare earth ions.

This second embodiment has the advantage of using standard microelectronics techniques, making it economically advantageous.

The invention also relates to a display device with several pixels, each pixel including at least:

a stack comprising at least one first portion of n-doped semiconductor, one second portion of p-doped semiconductor and one third portion of unintentionally doped semiconductor and disposed between the first and second portions, the semiconductors of the first, second and third portions corresponding to compounds comprising nitrogen atoms as well as aluminium and/or gallium and/or indium atoms;

first rare earth ions implanted in at least one first part of the third portion belonging to at least one first region of the stack intended to form at least one first light emission region, or at least one first sub-pixel;

second rare earth ions, of a nature different from that of the first rare earth ions, implanted in at least one second part of the third portion distinct from the first part of the third portion and belonging to at least one second region of the stack, distinct from the first region, intended to form at least one second light emission region, or at least one second sub-pixel;

third rare earth ions, of a nature different from that of the first and second rare earth ions, implanted in at least one third part of the third portion distinct from the first and second parts of the third portion and belonging to at least one third region of the stack, distinct from the first and second regions, intended to form at least one third light emission region, or at least one third sub-pixel.

A display device comprising several pixels is also proposed, including at least:

a stack comprising at least one first portion of n-doped semiconductor, one second portion of p-doped semiconductor and one third portion of unintentionally doped semiconductor and disposed between the first and second portions, the semiconductors of the first, second and third portions corresponding to compounds comprising nitrogen atoms as well as aluminium and/or gallium and/or indium atoms;

first rare earth ions implanted in first parts of the third portion belonging to first regions of the stack and intended to form, for each pixel, at least one first light emission region, or at least one first sub-pixel;

second rare earth ions, of a nature different from that of the first rare earth ions, implanted in second parts of the third portion distinct from the first parts of the third portion, belonging to second regions of the stack distinct from the first regions and intended to form, for each pixel, at least one second light emission region, or at least one second sub-pixel.

The display device may also include third rare earth ions, of a nature different from that of the first and second rare earth ions, implanted in third parts of the third portion distinct from the first and second parts of the third portion, belonging to third regions of the stack distinct from the first and second regions and intended to form, for each pixel, at least one third light emission region, or at least one third sub-pixel.

The first, second and third regions of the stack are distinct from each other in a plane parallel to an upper face of the stack (or any other "lateral" plane of the stack, such as for example a plane passing through an interface between two different portions of semiconductor of the stack). In other words, the different regions wherein the different rare earth ions are implanted correspond to regions which are not superposed on each other but which are disposed next to each other. In the plane parallel to the upper face of the stack, the regions of the stack wherein the implantations are made, and therefore also the different parts of the third portion of semiconductor wherein the implantations are made, are disposed next to each other.

The display device may also include fourth rare earth ions implanted in fourth parts of the third portion distinct from the first, second and third parts of the third portion, belonging to fourth regions of the stack distinct from the first, second and third regions and intended to form, for each pixel, at least one fourth light emission region, or at least one fourth sub-pixel.

BRIEF DESCRIPTION OF THE DRAWINGS

The present invention will be better understood upon reading the description of exemplary embodiments given purely in an indicative and non-limiting manner with reference to the appended drawings wherein.

Figure 1:
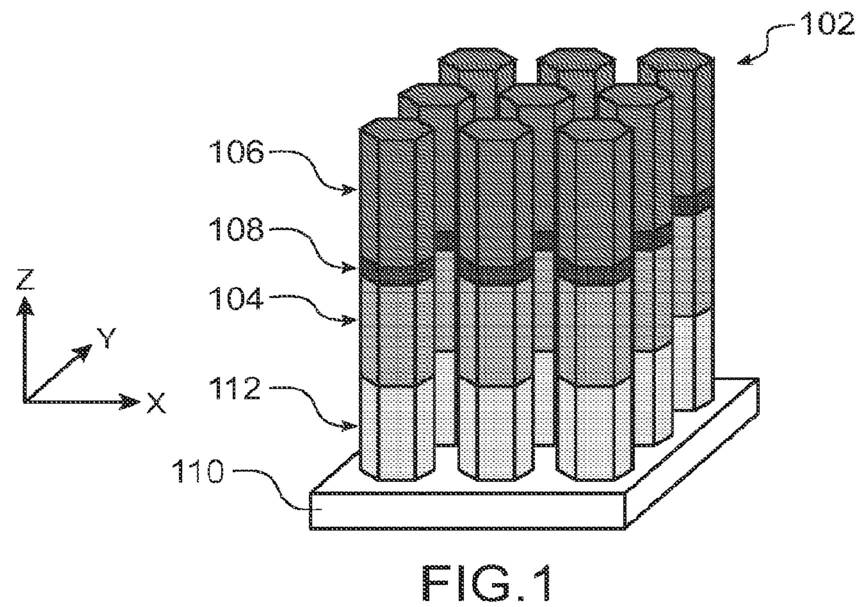
FIGS. 1 to 8 show the steps of a method for producing a display device according to a first embodiment.

Identical, similar or equivalent parts of the various figures described below bear the same numerical references so as to facilitate passage from one figure to another.

The different parts shown in the figures are not necessarily shown on a uniform scale, to make the figures more readable.

The different possibilities (variants and embodiments) must be understood as not mutually exclusive and can be combined with each other.

DETAILED DESCRIPTION OF PARTICULAR EMBODIMENTS

A method for producing a display device 100 including several pixels 101 according to a first embodiment is described below in connection with FIGS. 1 to 8.

A first step of this method consists in producing a stack 102 comprising at least a first portion 104 of n-doped semiconductor, a second portion 106 of p-doped semiconductor and a third portion 108 of unintentionally doped semiconductor disposed between the first and second portions. The semiconductors of the first, second and third portions 104, 106, 108 correspond to compounds comprising nitrogen atoms as well as aluminium and/or gallium and/or indium atoms.

The stack 102 is here produced on a substrate 110 comprising for example a semiconductor, this semiconductor being able to correspond for example to silicon. Alternatively, the substrate 110 may include sapphire or another material.

In the first embodiment described here, the first, second and third portions 104, 106, 108 are formed by nanowires produced by localised growth on the substrate 110. This localised growth may correspond to epitaxy of the MOCVD type (metal organic vapour phase epitaxy) or by molecular beam (also called MBE for "Molecular Beam Epitaxy"). To localise the growth on the substrate 110, the latter can be covered with a mask comprising for example TiN and wherein openings have been made by lithography. This mask is not visible in FIGS. 1 to 8.

According to a particular example, first regions of these nanowires are first of all formed on the substrate 110, in the form of portions 112 of n-doped GaN.

The growth of the nanowires is prolonged by forming second regions comprising, for example, n-doped AlN on the portions 112. The n-type doping is for example obtained by incorporating silicon and/or germanium atoms in the second regions of the nanowires during their growth. The concentration of dopants in the semiconductor of these second regions is for example comprised between $10^{17}$ at/cm$^3$ and $10^{20}$ at/cm$^3$ and advantageously $10^{19}$ at/cm$^3$ and $10^{20}$ at/cm$^3$.

These second regions form the first portion 104 of n-doped semiconductor of the stack 102. The dimension of the second regions parallel to the growth direction of the nanowires (dimension parallel to the axis Z in FIGS. 1 to 8), that is to say the length of the second regions of the nanowires, which also corresponds to the thickness of the first portion 104 of the stack 102, is for example equal to 500 nm, or more generally comprised between 100 and 1000 nm.

The growth of the nanowires is then prolonged by forming third regions comprising, for example, unintentionally doped AlN on the second regions, that is to say on the first portion 104. These third regions form the third portion 108 of unintentionally doped semiconductor of the stack 102. This third portion 108 will be used subsequently to form semiconductor emissive portions from which light will be emitted. The semiconductor of the third portion 108 is not intentionally doped, that is to say is not subjected, during the production of the device 100, to a step introducing doping atoms into this semiconductor. The dimension of the third regions parallel to the growth direction of the nanowires, that is to say the length of the third regions of the nanowires, which also corresponds to the thickness of the third portion 108 of the stack 102, is for example comprised between 5 nm and 50 nm.

The growth of the nanowires is then extended by forming fourth regions comprising for example p-doped AlN on the third regions, that is to say on the third portion 108. These fourth regions form the second portion 106 of p-doped semiconductor of the stack 102. The p-type doping is here advantageously obtained by incorporating magnesium and indium atoms in the fourth regions of the nanowires. Advantageously, the atomic concentration of magnesium in the semiconductor of these fourth regions of the nanowires is comprised between $10^{17}$ at/cm$^3$ and $10^{21}$ at/cm$^3$, and advantageously comprised between $10^{20}$ at/cm$^3$ and $10^{21}$ at/cm$^3$.

For the growth of the semiconductor of the second portion 106 by MBE, fluxes of aluminium, active nitrogen, indium and possibly gallium are sent to the growth surface which corresponds to the upper surface of the third portion 108, that is to say here the upper surfaces of the third regions of the nanowires. A flux of magnesium is also sent so that the semiconductor produced is p-doped with the magnesium atoms. The values of these fluxes, that is to say the amount of atoms sent of each of these chemical elements, are chosen according to the desired composition for the semiconductor of the second portion 106 and in particular in such a way that the atomic concentration of indium is comprised between 0 and 1% and preferably equal to 0.1%. In the presence of this flux of indium, the atomic concentration of magnesium in the semiconductor of the second portion 106 is proportional to the amount of indium incorporated into this semiconductor and is for example comprised between $10^{17}$ at/$cm^3$ and $10^{21}$ at/$cm^3$, and advantageously comprised between $10^{20}$ at/$cm^3$ and $10^{21}$ at/$cm^3$, that is to say an atomic concentration of magnesium comprised between 0.1% and 1%.

During growth by MOCVD, the elements used for the growth of the semiconductor are organometallic precursors, for example trimethylaluminium or triethylaluminium used as an aluminium source, ammonia used as a nitrogen source, trimethylindium or triethylindium used as an indium source, and optionally trimethylgallium or triethylgallium used as a gallium source. The magnesium atoms are obtained by an appropriate precursor, for example a solution of magnesocene or $Mg(Cp)_2$. Indium and magnesium concentrations obtainable by MOCVD can be similar to those obtained by MBE.

The dimension of the fourth regions parallel to the growth direction of the nanowires, that is to say the length of the fourth regions of the nanowires, which also corresponds to the thickness of the second portion 106 of the stack 102, is chosen to be compatible with the penetration depth of rare earth ions which will be implanted subsequently in the third portion 108, this depth of penetration of the rare earth ions being dependent on the energy with which the implantations are implemented. For example, for a typical implantation energy of 300 keV, the thickness of the second portion 106 can be chosen equal to about 50 nm.

The diameter of each nanowire is for example comprised between 100 nm and 150 nm. The period, or the repetition pitch, with which the nanowires are made, which corresponds to the distance between the centres of two neighbouring nanowires, is for example comprised between 150 nm and 300 nm. According to a particular exemplary embodiment, the value of the period can be equal to twice that of the diameter of one of the nanowires.

FIG. 1 schematically shows the stack 102 obtained at this stage of the method.

Figure 2:
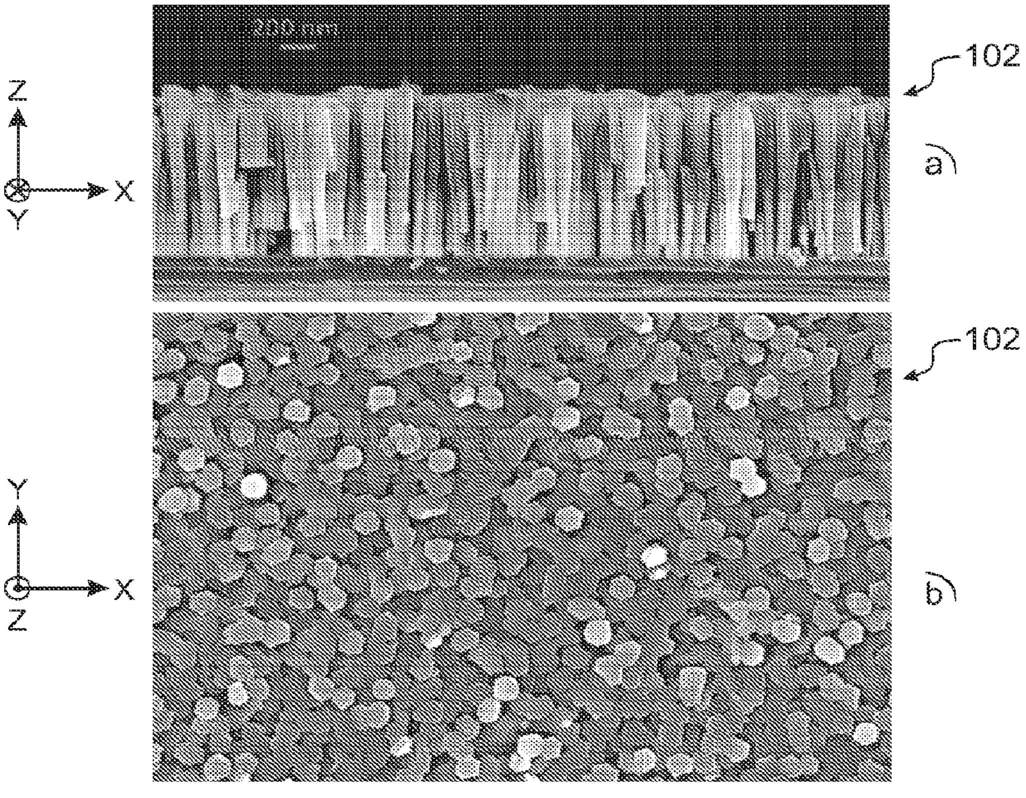

FIG. 2 shows a sectional view (view a) and a top view (view b) of the stack 102, obtained by scanning electron microscopy.

Alternatively, the stack 102 may not include the portions 112.

In the stack 102, the first, second and third portions 104, 106, 108 form a set of p-i-n junctions intended to form the LEDs of the device 100.

In the stack 102 described above, the first, second and third portions 104, 106, 108 comprise AlN. More generally, these portions 104, 106, 108 may include a compound comprising nitrogen atoms as well as aluminium and/or gallium and/or indium atoms. According to an exemplary embodiment, the semiconductor of the first portion 104 may therefore correspond to $Al_{x1}Ga_{(1-x1)}N$, with $0 \leq X1 \leq 1$, with preferentially $0.7 \leq X1 \leq 1$. The semiconductor of the first portion 104 may also include indium atoms, the compound of the first portion 104 possibly corresponding in this case to AlGaInN or InGaN. According to another exemplary embodiment, the semiconductor of the third portion 108 may correspond to $Al_{x4}Ga_{(1-x4)}N$, with $X4<X1$, and preferentially $X4 \leq 0.9.X1$. According to another exemplary embodiment, the second portion 106 may include $Al_{x2}Ga_{(1-X2-Y2)}In_{Y2}N$ p-doped with magnesium and indium atoms, with $X2>0$, $Y2>0$ and $X2+Y2 \leq 1$. Advantageously, the semiconductor of the second portion 106 is such that $X2=X1$. In addition, it is advantageous to have $0<Y2 \leq 0.01$, and preferentially $Y2=0.001$.

According to a variant embodiment, the stack 102 may include at least one unintentionally doped AlGaN portion disposed between the first portion 104 and the third portion 108, and/or between the third portion 108 and the second portion 106. Such unintentionally doped AlGaN portion disposed between the third portion 108 and the second portion 106 forms an electron blocking layer which allows to avoid the surplus of electrons in the p-doped zone and to promote the recombination of the charge carriers in the third portion.

Advantageously, a step of activating the p-type dopants present in the produced structure is implemented. This activation step may correspond to the implementation of thermal annealing and/or electron beam irradiation. The thermal annealing is for example carried out at a temperature comprised between 100° C. and 1000° C., and preferably equal to 700° C. Irradiation by electron beam consists in sending one or more electron beams onto the structure produced, through the upper face formed by the second portion 106. The energy of the electrons is for example equal to 3 keV, or more generally comprised between approximately 2 keV and 30 keV and chosen in particular according to the thickness of the second portion 108. The dose is fixed by the value of the current of the electron beam and can vary between 1 mA/$cm^2$ and 20 mA/$cm^2$, and is preferably equal to 7 mA/$cm^2$. This electronic irradiation is carried out for a duration for example equal to 10 minutes.

Figure 3:
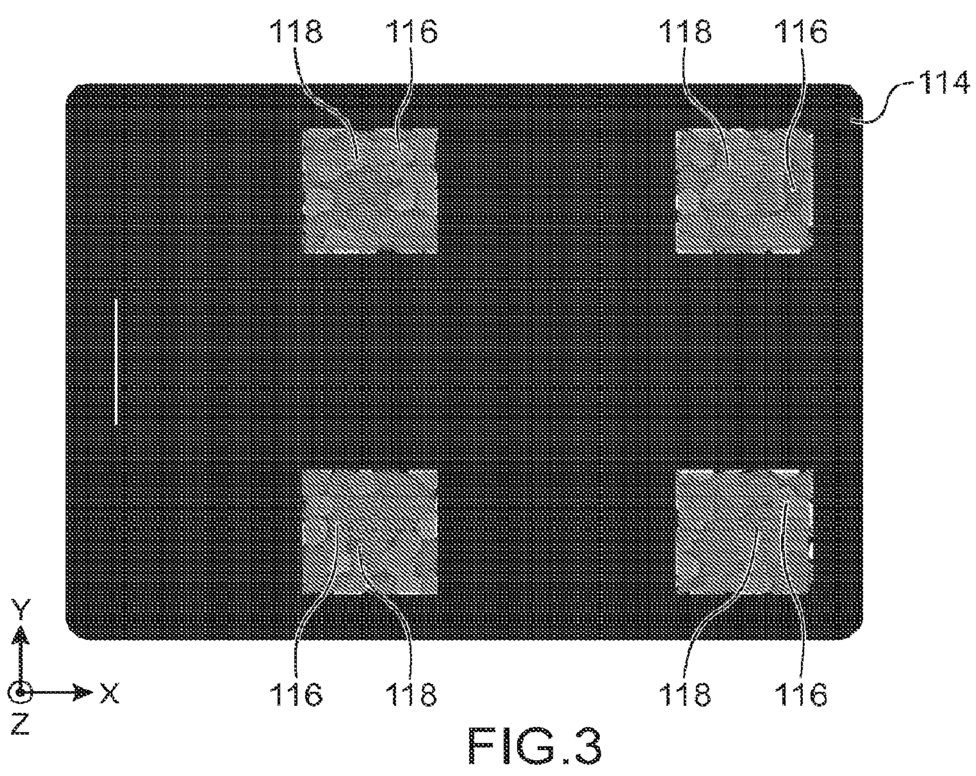
Figure 4:
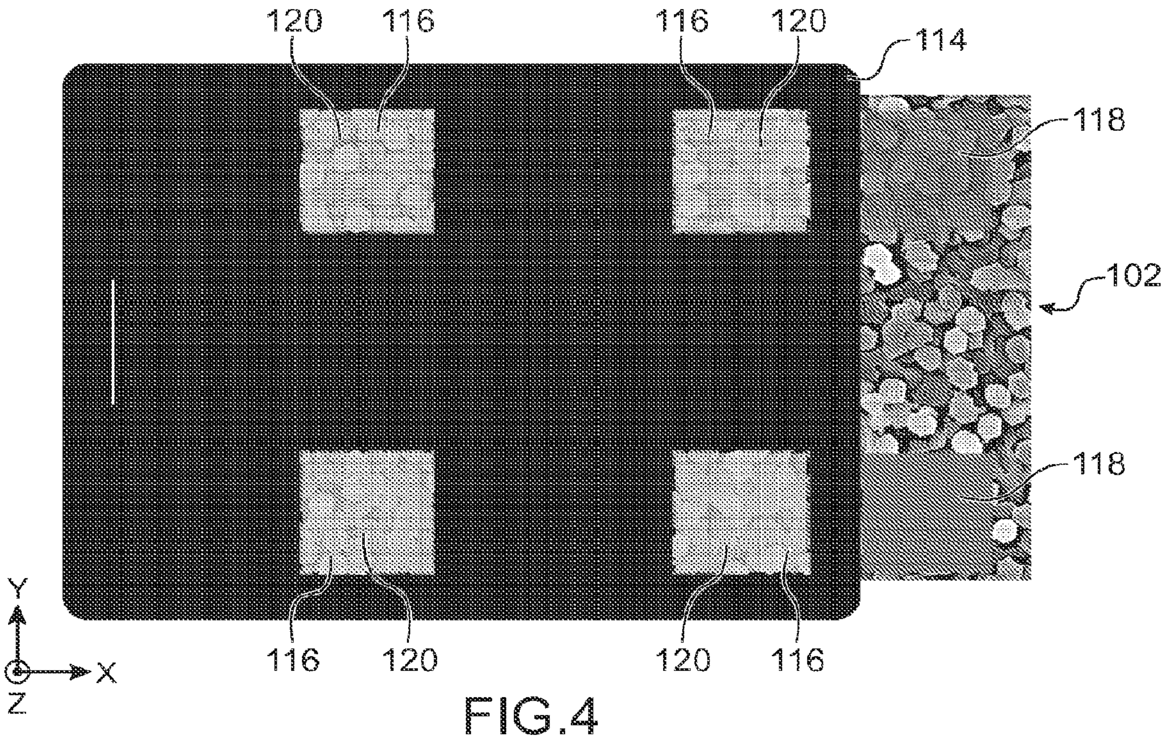
Figures 5, 6:
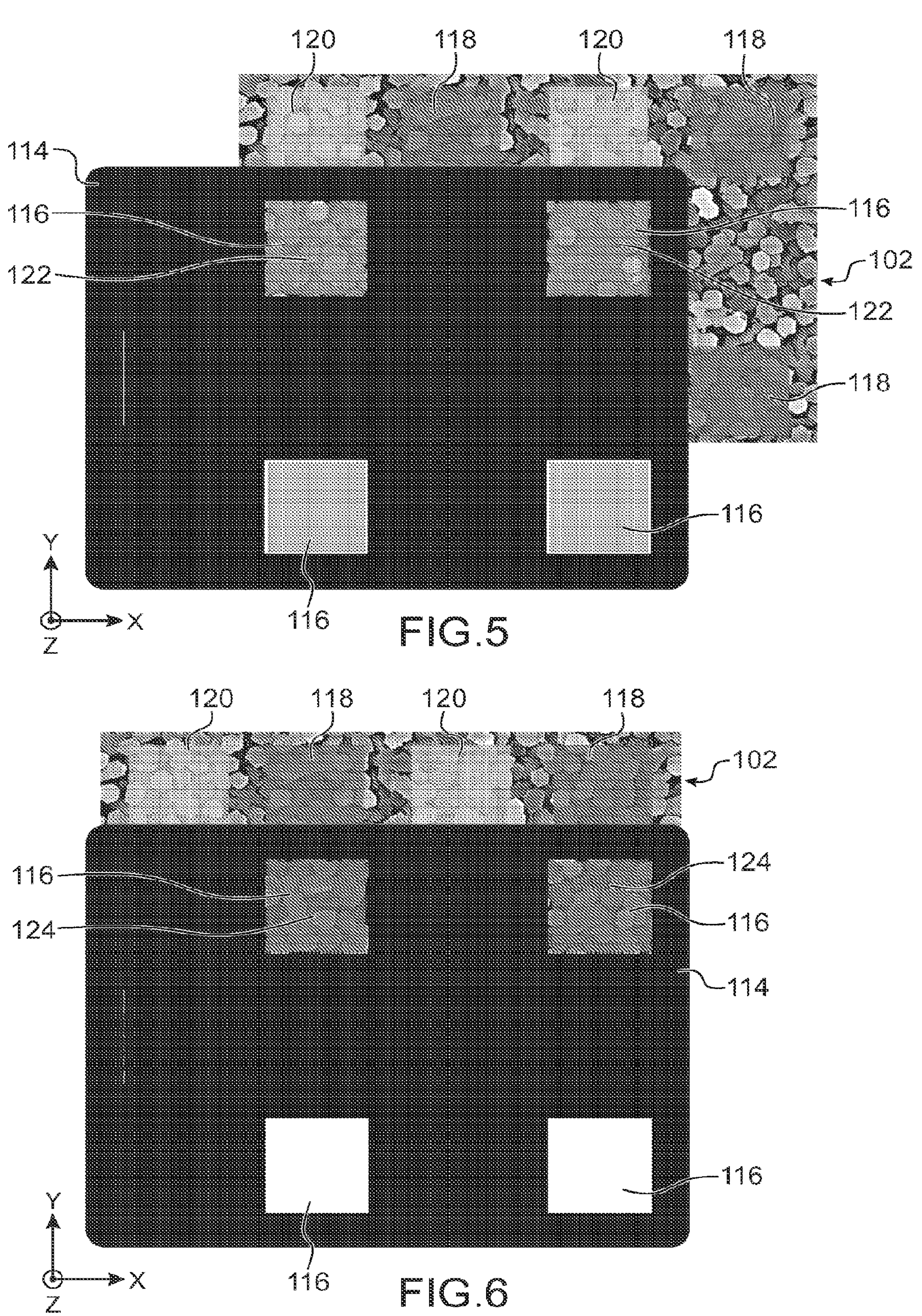

After the stack 102 has been produced, an implantation of first rare earth ions in first parts of the third portion 108, through a mask 114 comprising openings 116 disposed facing first regions 118 of the stack 102 intended to form, for each pixel 101 of the device 100, at least one first light emission region, or at least one first sub-pixel, is implemented (see FIG. 3 representing a partial top view of the stack 102 on which the mask 114 is disposed). The first parts of the third portion 108 correspond to the parts of the third portion 108 forming part of the first regions 118 of the stack 102.

In the embodiment described here, these first rare earth ions correspond to europium ions. Thus, the first light emission regions made are capable of emitting light of red colour and form red light emission sub-pixels of each pixel 101, each sub-pixel generally including several nanowires.

Alternatively, it is possible to implant praseodymium ions in order to produce light emission regions of red colour.

Furthermore, it is possible to implant, during this first implantation step, several types of rare earth ions and/or other atoms in the first parts of the third portion 108.

In addition, in the exemplary embodiment described here, each opening 116 has a shape, in the plane of the main faces of the mask 114 or in the plane parallel to the upper face of the stack 102 facing which the mask 114 is disposed during implantation, which is substantially square or rectangular. The dimensions of each opening 116 in this plane are for example comprised between 1×1 $\mu m^2$ and 4×4 $\mu m^2$. When these dimensions are equal to 1×1 $\mu m^2$, each of the first regions 118 of the stack 102 wherein this implantation is carried out can include approximately one hundred nanowires.

In the first embodiment described here, the mask 114 corresponds to a hard mask comprising for example silicon nitride, SiN. Details of implementations of such an implantation are for example given in the document L. G. Villanueva and al., "Localized Ion Implantation Through Micro/Nanostencil Masks", IEEE Trans. On Nanotechnology, 10, 940 (2011).

The mask 114 is then moved so that the openings 116 are disposed facing second regions 120 of the stack 102, distinct from the first regions 118, and intended to form, for each pixel 101 of the device 100, at least one second light emission region or at least one second sub-pixel. An implantation of second rare earth ions, of a nature different from that of the first rare earth ions, in second parts of the third portion 108 distinct from the first parts of the third portion 108 and forming part of the second regions 120 of the stack 102, is then implemented through the mask 114 (see FIG. 4).

In the exemplary embodiment described here, the second rare earth ions correspond to terbium and/or erbium ions. Thus, the second light emission regions made are capable of emitting light of green colour and form green light-emitting sub-pixels of each pixel 101.

Alternatively, it is possible to implant holmium ions to produce green light emission regions.

Furthermore, it is possible to implant, during this second implantation step, several types of rare earth ions and/or other atoms in the second parts of the third portion 108.

The mask 114 is then moved so that the openings 116 are disposed facing third regions 122 of the stack 102, distinct from the first and second regions 118, 120, and intended to form, for each pixel 101 of the device 100, at least one third light emission region or at least one third sub-pixel. An implantation of third rare earth ions, of a nature different from those of the first and second rare earth ions, in third parts of the third portion 108 distinct from the first and second parts of the third portion 108 and forming part of the third regions 122 of the stack 102, is then implemented through the mask 114 (see FIG. 5).

In the exemplary embodiment described here, the third rare earth ions correspond to thulium ions. Thus, the third light emission regions produced are capable of emitting light of blue colour and form blue light emission sub-pixels of each pixel 101.

Alternatively, it is possible to implant cerium ions to produce blue light emission regions.

Furthermore, it is possible to implant, during this third implantation step, several types of rare earth ions and/or other atoms in the third parts of the third portion 108.

The mask 114 is then moved so that the openings 116 are disposed facing fourth regions 124 of the stack, distinct from the first, second and third regions 118, 120 and 122, and intended to form, for each pixel 101 of the device 100, at least a fourth light-emitting region or at least a fourth sub-pixel. An implantation of fourth rare earth ions, for example of a nature similar to that of the first or second or third rare earth ions, in fourth parts of the third portion 108 distinct from the first, second and third parts of the third portion 108 and forming part of the fourth regions 124 of the stack 102, is then implemented through the mask 114 (see FIG. 6).

In the exemplary embodiment described here, the fourth rare earth ions correspond to europium ions. Thus, the fourth light emission regions produced are able to emit red light and form second red light emission sub-pixels of each pixel 101. This allows to reinforce the light emission of each pixel 101 in the wavelength range corresponding to the red colour where the human eye is less sensitive, and also optimise the emission of light of white colour by the pixels 101.

Furthermore, it is possible to implant, during this fourth implantation step, several types of rare earth ions and/or other atoms in the fourth parts of the third portion 108.

In the exemplary embodiment described here, the four light-emitting regions of each pixel 101, that is to say the four sub-pixels of each pixel 101, are disposed forming a square-shaped matrix of 2×2 sub-pixels. In this example, each sub-pixel has dimensions, in the plane (X, Y), equal to 1×1 $\mu m^2$, and each pixel 101 has dimensions, in the plane (X, Y), equal to 2, 5×2.5 $\mu m^2$.

According to another exemplary embodiment, each sub-pixel has dimensions, in the plane (X, Y), equal to 4×4 $\mu m^2$, and each pixel 101 has dimensions, in the plane (X, Y), of the order of 8×8 $\mu m^2$. In this case, when the diameter of each nanowire is equal to approximately 150 nm and the nanowires are produced with a period equal to approximately 300 nm, each sub-pixel includes approximately 170 nanowires.

The energy with which the rare earth ions are implanted is for example equal to 300 keV. The rare earth ions thus implanted have, within each nanowire, a Gaussian distribution centred on the third portion 108.

Figure 7:
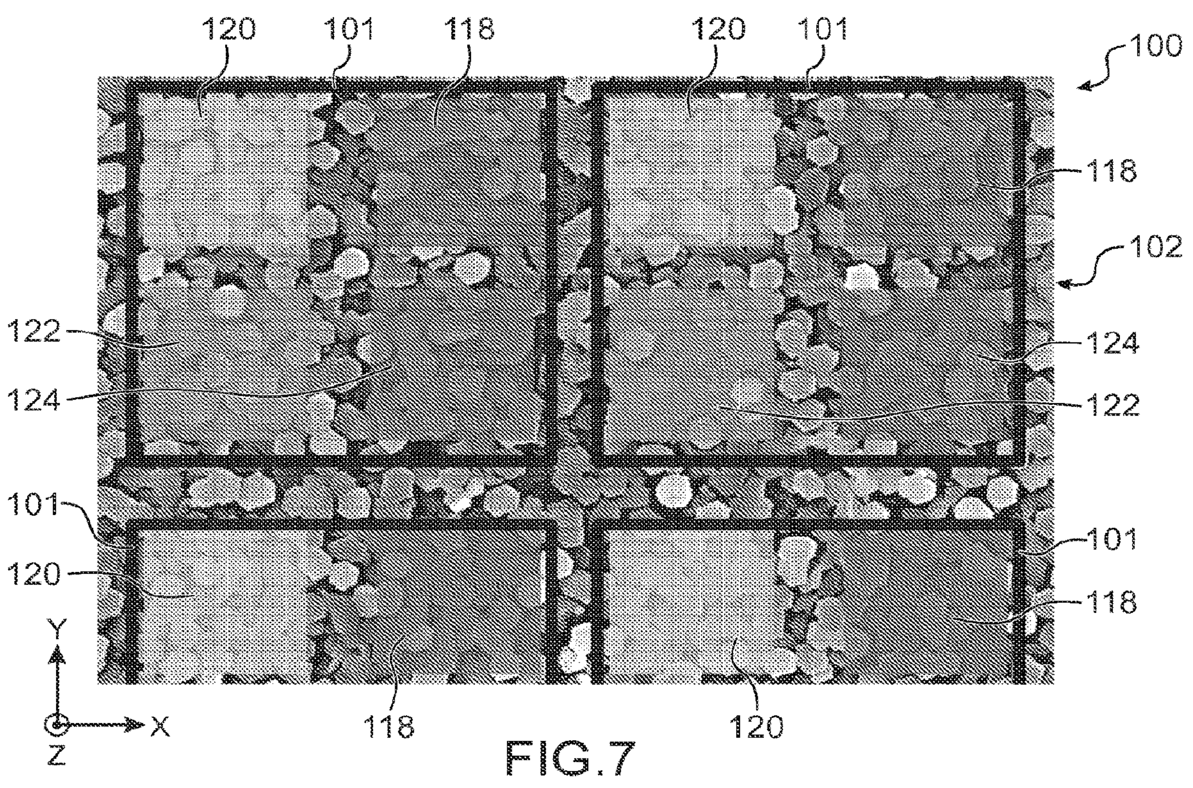

FIG. 7 shows two pixels 101 and part of two other pixels 101 obtained by implementing the steps described above.

A planarization can then be implemented at the top of the nanowires forming the stack 102, that is to say at the upper faces of the fourth regions of the nanowires.

Figure 8:
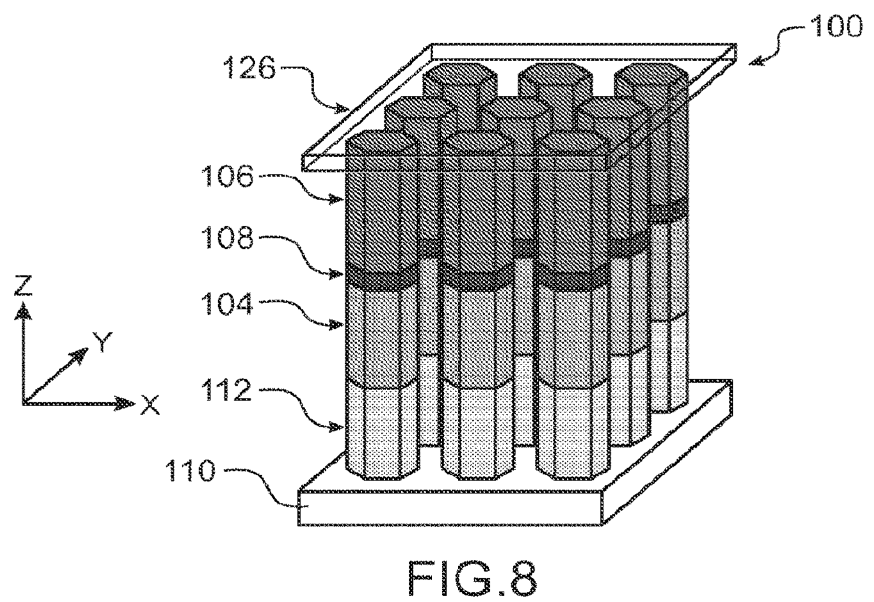
Figure 9:
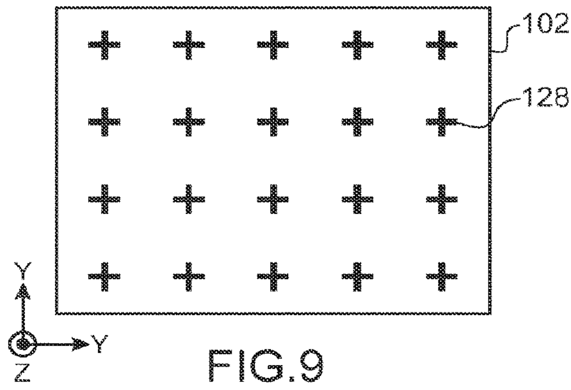
FIGS. 9 to 12 show part of the steps of a method for producing a display device according to a second embodiment.

A high temperature thermal annealing, for example 1200° C., of the stack 102 can then be implemented, thereafter electrodes 126 are then made individually on the parts of the stack 102 forming each sub-pixel, for example based on indium tin oxide (ITO) (see FIG. 8).

A method for producing a display device 100 including several pixels 101 according to a second embodiment is described below in connection with FIGS. 9 to 12.

A stack 102 similar to that previously described for the first embodiment is first made.

When spaces are present between the nanowires, a step of depositing an electrically insulating material, for example $Al_2O_3$ or $SiO_2$ deposited by atomic layer deposition (ALD) or for example a silica gel or parylene deposited by spin coating, between the nanowires can be implemented. The material thus deposited fills the interstices between the nanowires. A planarization step can then be implemented so that the upper surface of the stack 102 is flat.

Alignment marks 128, for example in the shape of a cross as in the embodiment shown in FIGS. 9 to 12, can then be produced on the upper surface of the stack 102. These alignment marks 128 are for example produced on the upper surface of the stack 102 by photolithography according to the desired pattern of the alignment marks 128, resin development, deposition of a metal material (Ti and/or Au for example), then removal of the resin (or "lift-off"), the metal material remaining on the upper surface of the stack 102 forming the alignment marks 128.

The alignment marks 128 will be used to identify the regions of the stack 102 wherein the rare earth ions will be implanted and thus facilitate the production of the masks used for the implantation of the rare earth ions.

A first photosensitive resin mask is produced by photolithography, insolation and etching on the upper face of the stack 102. This first mask is produced such that it includes openings disposed facing the first regions 118 of the stack 102 intended to form, for each pixel 101, at least one first light emission region or at least one first sub-pixel. The alignment marks 128 are used to precisely locate the locations of the openings of the first mask. This first mask has for example a thickness comprised between 1 μm and 10 μm.

First rare earth ions are then implanted in the first regions 118 of the stack 102, in a manner similar to that previously described in connection with the first embodiment, that is to say such that these ions are located mainly in the third portion 108.

In the exemplary embodiment described here, the first rare earth ions correspond to thulium ions. Thus, the first light emission regions made are capable of emitting light of blue colour.

As in the first embodiment, it is possible to implant cerium ions to produce blue light emission regions. Furthermore, it is possible to implant, during this first implantation step, several types of rare earth ions and/or other atoms in the first parts of the third portion 108.

At the end of this implantation, the first mask is removed, for example by etching.

Figure 10:
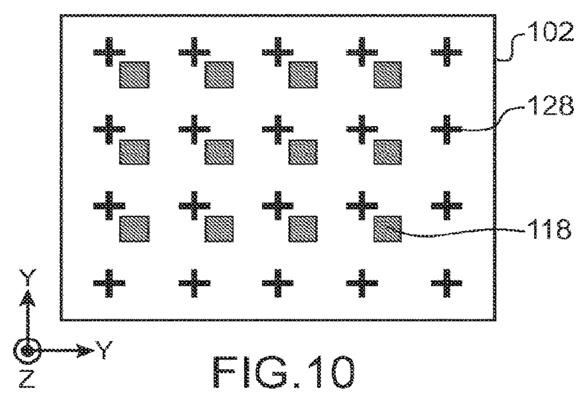

FIG. 10 schematically shows the structure obtained after the implementation of this first implantation.

A second photosensitive resin mask is then produced by photolithography, exposure and etching on the upper face of the stack 102. This second mask is produced such that it includes openings disposed facing the second regions 120 of the stack 102 intended to form, for each pixel 101, at least one second light emission region or at least one second sub-pixel. The alignment marks 128 are used to precisely locate the locations of the second mask openings. Like the first mask, this second mask has for example a thickness comprised between 1 μm and 10 μm.

Second rare earth ions are then implanted in the second regions 120 of the stack 102, in a manner similar to that previously described in connection with the first embodiment, that is to say such that these ions are mainly localised in the third portion 108.

In the exemplary embodiment described here, the second rare earth ions correspond to terbium and/or erbium ions. Thus, the second light emission regions obtained are capable of emitting light of green colour.

As in the first embodiment, it is possible to implant holmium ions to produce green light emission regions. Furthermore, it is possible to implant, during this second implantation step, several types of rare earth ions and/or other atoms in the second parts of the third portion 108.

At the end of this implantation, the second mask is removed, for example by etching.

Figure 11:
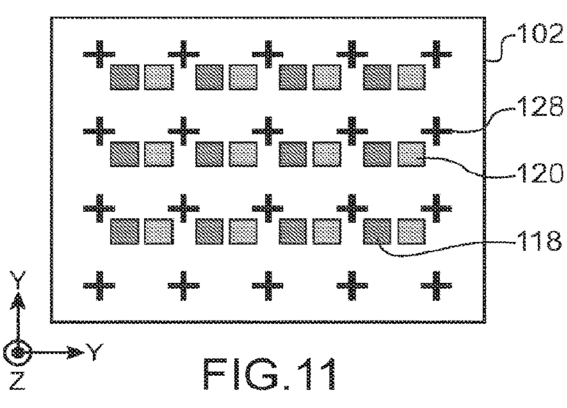

FIG. 11 schematically shows the structure obtained after the implementation of this second implantation.

A third resin mask is then produced by photolithography, insolation and etching on the upper face of the stack 102. This third mask is made such that it includes openings disposed facing third regions 122 of stack 102 intended to form, for each pixel 101, at least one third light emission region or at least one third sub-pixel. In the embodiment described here, the third regions 122 of the stack 102 are intended to form, for each pixel 101, two third light emission regions or two sub-pixels. The alignment marks 128 are used to precisely locate the locations of the third mask openings. Like the first and second masks, this third mask has for example a thickness comprised between 1 μm and 10 μm.

Third rare earth ions are then implanted in the third regions 122 of the stack 102, in a manner similar to that previously described in connection with the first embodiment, that is to say such that these ions are located mainly in the third portion 108.

In the exemplary embodiment described here, the third rare earth ions correspond to europium ions. Thus, the third light emission regions produced in each pixel 101 are capable of emitting light of red colour.

As in the first embodiment, it is possible to implant praseodymium ions to produce light of red colour emission regions. Furthermore, it is possible to implant, during this third implantation step, several types of rare earth ions and/or other atoms in the first parts of the third portion 108.

At the end of this implantation, the third mask is removed, for example by etching.

Figure 12:
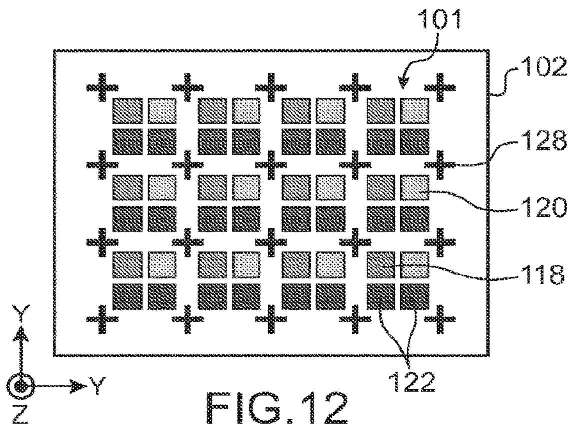

FIG. 12 schematically shows the structure obtained after the implementation of this third implantation.

The device 100 is then completed by producing electrodes 126 on the parts of the stack 102 forming each sub-pixel. If a planarization has previously been implemented following the deposition of the electrical insulating material in the spaces between the nanowires, the electrodes 126 can be produced directly on the upper surface of the stack 102 without having to implement a new planarization.

As a variant of the exemplary embodiments described above, for both embodiments, it is possible for the rare earth ions implanted in the different regions of the stack 102 to be different from those previously described. The arrangement of the different light emission regions within each pixel 101 can also be different from those previously described.

In the embodiments described above, the implantations of rare earth ions are implemented to form, for each pixel 101, four distinct light emission regions and therefore four sub-pixels. Alternatively, it is possible that the rare earth ion implantation steps are implemented such that each pixel 101 includes only three distinct light emission regions or sub-pixels, or else more than four light emission regions or sub-pixels.

The mask(s) used during the rare earth ion implantation steps may include openings such that, at each implantation, one or more light emission regions are formed within each pixel 101 of the device, or more generally within one or more pixels 101.

In the two embodiments previously described, the stack 102 is formed by a set of nanowires produced directly on the substrate 110. Alternatively, the different portions of the stack 102 (first, second and third portions 104, 106, 108, and the first regions 112) can be made in the form of layers stacked on top of each other and deposited on the substrate 110 by implementing successive deposition steps, for example epitaxy, then optionally etching this set of layers. According to another variant, the stack 102 can include a set of nanowires obtained by etching a stack of layers ("top down" approach).

In the exemplary embodiments described above, the second portion 106 is produced before the implementation of the rare earth ion implantation steps. Alternatively, it is possible for the second portion 106 to be produced after the implementation of the rare earth ion implantation steps. In this case, the first and third portions 104 and 108 can be made by growth. The growth is then interrupted, then the implantation steps are implemented. After these implantations, growth is restarted to produce the second portion 106.

The invention claimed is:

1. A method for producing a display device comprising several pixels, the production of each pixel comprises:

producing a stack comprising at least a first portion of a n-doped semiconductor and a third portion of an unintentionally doped semiconductor disposed on the first portion, wherein the semiconductors of the first and third portions correspond to compounds comprising nitrogen atoms and aluminum atoms, gallium atoms, indium atoms, or a combination thereof, then implanting first rare earth ions in at least one first part of the third portion through a first mask comprising at least one first opening disposed facing at least one first region of the stack, thereby forming at least one first light emission region;

implanting second rare earth ions different from the first rare earth ions, in at least one second part of the third portion distinct from the first part of the third portion, through a second mask comprising at least one second opening disposed facing at least one second region of the stack distinct from the first region, thereby forming at least one second light emission region, implanting third rare earth ions different from the first and second rare earth ions, in at least one third part of the third portion distinct from the first and second parts of the third portion, through a third mask comprising at least one third opening disposed facing at least one third region of the stack distinct from the first and second regions, thereby forming at least one third light emission region;

wherein the stack further comprises a second portion of the p-doped semiconductor such that the third portion is disposed between the first and second portions, wherein the semiconductor of the second portion corresponds to a compound comprising nitrogen atoms and aluminum atoms, gallium atoms, indium atoms, or a combination thereof, wherein the second portion is produced before or after the implanting the first, second and third rare earth ions; and wherein the first, second and third regions of the stack are distinct from each other in a plane parallel to an upper face of the stack.

2. The method of claim 1, wherein:

the semiconductor of the second portion is doped with magnesium atoms, indium atoms, or a combination thereof, and/or the semiconductor of the first portion is doped with silicon atoms, germanium atoms, or a combination thereof.

3. The method of claim 2, wherein:

an atomic concentration of magnesium in the semiconductor of the second portion is from $10^{20}$ at/cm$^3$ to $10^{21}$ at/cm$^3$, and/or the atomic concentration of silicon, germanium, or a combination thereof in the semiconductor of the first portion is from $10^{19}$ at/cm$^3$ to $10^{20}$ at/cm$^3$.

4. The method of claim 1, wherein the first, second and third earth ions are selected such that the first, second and third light emission regions are capable of emitting wavelengths respectively of red, green and blue colour.

5. The method of claim 1, further comprising, for the production of each pixel:

implanting fourth rare earth ions-after the implanting the third rare earth ions, in at least a fourth part of the third portion distinct from the first, second and third parts of the third portion, through a fourth mask comprising at least one fourth opening disposed facing at least one fourth region of the stack distinct from the first, second and third regions, thereby forming at least one fourth light emission region.

6. The method of claim 5, wherein in the implanting the first, second, third and fourth rare earth ions the first, second, third and fourth light emission regions are arranged, in each pixel, in the form of a 2×2 matrix.

7. The method of claim 1, wherein the first, second and third rare earth ions are selected from the group consisting of europium, terbium, erbium, and thulium ions, or a combination thereof.

8. The method of claim 1, wherein the stack is produced on a substrate, and wherein the stack further comprises at least a n-doped GaN portion disposed between the substrate and the first portion.

9. The method of claim 1, wherein the production of the stack is carried out by:

growing nanowires, depositing planar layers, or depositing planar layers and then etching the deposited planar layers, thereby forming nanowires.

10. The method of claim 9, further comprising, when the stack is produced by the growing nanowire, depositing an electrically insulating material between the nanowires after carrying out the production of the stack and before implanting the first rare earth ions.

11. The method of claim 1, wherein the semiconductors of the first, second and third portions comprise AlN.

12. The method of claim 1, wherein:

the first, second and third masks correspond to the same hard mask whose positions relative to the stack during the implantations of the first, second and third rare earth ions are different from each other, and when the method-further comprises implanting fourth rare earth ions, a fourth mask corresponds to the same hard mask as that forming the first, second and third masks and whose position relative to the stack during the implantation of the fourth rare earth ions is different from those during the implantations of the first, second and third rare earth ions, wherein the implanting the fourth rare earth ions is carried out after the implanting the third rare earth ions, in at least a fourth part of the third portion distinct from the first, second and third parts of the third portion, through the fourth mask comprising at least one fourth opening disposed facing at least one fourth region of the stack distinct from the first, second and third regions, thereby forming at least one fourth light emission region.

13. The method of claim 1, wherein:

the first mask is based on a photosensitive resin and is removed before the implantation of the second rare earth ions, and the second mask is based on a photosensitive resin and is removed after the implantation of the second rare earth ions, and the third mask is based on a photosensitive resin and is removed after the implantation of the third rare earth ions, and when the method further comprises implanting fourth rare earth ions, a fourth mask is based on a photosensitive resin and is removed after the implantation of the fourth rare earth ions.

14. A display device comprising several pixels, each pixel comprises:

a stack comprising at least a first portion of a n-doped semiconductor, a second portion of the p-doped semiconductor and a third portion of an unintentionally doped semiconductor disposed between the first and second portions, wherein the semiconductors of the first, second and third portions correspond to compounds comprising nitrogen atoms and aluminum atoms, gallium atoms, indium atoms, or a combination thereof;

first rare earth ions implanted in at least one first part of the third portion belonging to at least one first region of the stack, to form at least one first light emission region;

second rare earth ions, different from the first rare earth ions, implanted in at least one second part of the third portion distinct from the first part of the third portion and belonging to at least one second region of the stack, distinct from the first region, to form at least one second light emission region;

third rare earth ions, different from the first and second rare earth ions, implanted in at least one third part of the third portion distinct from the first and second parts of the third portion and belonging to at least one third region of the stack, distinct from the first and second regions, to form at least one third light emission region; and wherein the first, second and third regions of the stack are distinct from each other and are located in mutually exclusive locations on the same geometrical plane parallel to the upper face of the stack.

* * * * *